(12) United States Patent
Yan

(10) Patent No.: US 9,806,199 B2
(45) Date of Patent: Oct. 31, 2017

(54) THIN FILM TRANSISTOR, ARRAY SUBSTRATE AND DISPLAY DEVICE HAVING THE SAME, AND METHOD OF MANUFACTURING THEREOF

(71) Applicant: BOE TECHNOLOGY GROUP CO., LTD., Beijing (CN)

(72) Inventor: Liangchen Yan, Beijing (CN)

(73) Assignee: BOE TECHNOLOGY GROUP CO., LTD., Chaoyang District, Beijing (CN)

( * ) Notice: Subject to any disclaimer, the term of this patent is extended or adjusted under 35 U.S.C. 154(b) by 0 days.

(21) Appl. No.: 15/037,857

(22) PCT Filed: Dec. 10, 2015

(86) PCT No.: PCT/CN2015/097050
§ 371 (c)(1),
(2) Date: May 19, 2016

(87) PCT Pub. No.: WO2016/180016
PCT Pub. Date: Nov. 17, 2016

(65) Prior Publication Data
US 2017/0110584 A1    Apr. 20, 2017

(30) Foreign Application Priority Data

May 12, 2015  (CN) .......................... 2015 1 0239500

(51) Int. Cl.
*H01L 29/786* (2006.01)
*H01L 29/66* (2006.01)
(Continued)

(52) U.S. Cl.
CPC .... *H01L 29/7869* (2013.01); *H01L 21/02565* (2013.01); *H01L 21/02664* (2013.01);
(Continued)

(58) Field of Classification Search
CPC ......... H01L 21/02565; H01L 21/02664; H01L 21/423; H01L 21/477; H01L 29/24; H01L 29/66969; H01L 29/7869
See application file for complete search history.

(56) References Cited

U.S. PATENT DOCUMENTS 9,396,940 B2 *   7/2016  Ye
2004/0157473 A1 * 8/2004  Hayashi ............ H01L 21/28202
                                                 438/785
(Continued)

FOREIGN PATENT DOCUMENTS

CN     103296087 A    9/2013
CN     103403873 A   11/2013
(Continued)

OTHER PUBLICATIONS

International Search Report & Written Opinion dated Mar. 18, 2016 regarding PCT/CN2015/097050.
(Continued)

*Primary Examiner* — Allan R Wilson
(74) *Attorney, Agent, or Firm* — Intellectual Valley Law, P.C.

(57) ABSTRACT

The disclosure provides a method of manufacturing a thin film transistor on a base substrate by patterning an active layer comprising a metal oxynitride, and treating the active layer with a plasma comprising oxygen.

14 Claims, 5 Drawing Sheets

(51) Int. Cl.
  H01L 29/24    (2006.01)
  H01L 21/423   (2006.01)
  H01L 21/477   (2006.01)
  H01L 21/02    (2006.01)

(52) U.S. Cl.
  CPC .......... *H01L 21/423* (2013.01); *H01L 21/477* (2013.01); *H01L 29/24* (2013.01); *H01L 29/66969* (2013.01)

(56) References Cited

U.S. PATENT DOCUMENTS

| | | | |
|---|---|---|---|
| 2006/0246644 A1* | 11/2006 | Isobe | H01L 27/1266 438/197 |
| 2009/0311876 A1* | 12/2009 | Terasaki | H01J 37/3244 438/765 |
| 2012/0256276 A1* | 10/2012 | Hwang | H01L 21/82384 257/410 |
| 2014/0363934 A1* | 12/2014 | Ye | H01L 21/02521 438/158 |
| 2015/0034942 A1* | 2/2015 | Kim | H01L 29/7869 257/43 |

FOREIGN PATENT DOCUMENTS

| | | |
|---|---|---|
| CN | 103608925 A | 2/2014 |
| CN | 103745955 A | 4/2014 |
| CN | 103872138 A | 6/2014 |
| CN | 104167365 A | 11/2014 |
| CN | 104916546 A | 9/2015 |

OTHER PUBLICATIONS

The First Office Action in the Chinese Patent Application No. 201510239500.5, dated Apr. 24, 2017; English translation attached.

* cited by examiner

THIN FILM TRANSISTOR, ARRAY SUBSTRATE AND DISPLAY DEVICE HAVING THE SAME, AND METHOD OF MANUFACTURING THEREOF

CROSS-REFERENCE TO RELATED APPLICATION

This application is a national stage application under 35 U.S.C. §371 of International Application No. PCT/CN2015/097050 filed Dec. 10, 2015, which claims priority to Chinese Patent Application No. 201510239500.5, filed May 12, 2015, the contents of which are incorporated by reference in the entirety.

FIELD

The present invention relates to display technology, specifically, a thin film transistor, an array substrate and a display device having the same, and a method of manufacturing thereof.

BACKGROUND

Thin film transistor (TFT) is a type of field effect transistor mainly used in display panel devices.

Thin film transistor liquid crystal display (TFT-LCD) occupies a dominant position in the current flat panel display market due to the features of small size, low power consumption, relatively low manufacturing cost and no radiation, and so on.

Active matrix organic light emitting diode (AMOLED) display panel, also known as next generation display technology, uses independent thin film transistor to control each pixel. Each pixel can continuously and independently drive light emitting. As compared to conventional TFT-LCD display panel, AMOLED display panel has the features of faster response, higher contrast, and wider viewing angle, and so on.

ZnON has been widely studied as a potential candidate for making thin film transistor active layer. However, as a thin film transistor active layer material, ZnON has exceedingly high turn-off current (I r) and very large negative shift of the turn-on voltage. These electrical characteristics limit its use in semiconductor display field.

BRIEF DESCRIPTION OF THE FIGURES

The following drawings are merely examples for illustrative purposes according to various disclosed embodiments and are not intended to limit the scope of the present invention.

SUMMARY

Figure 1:
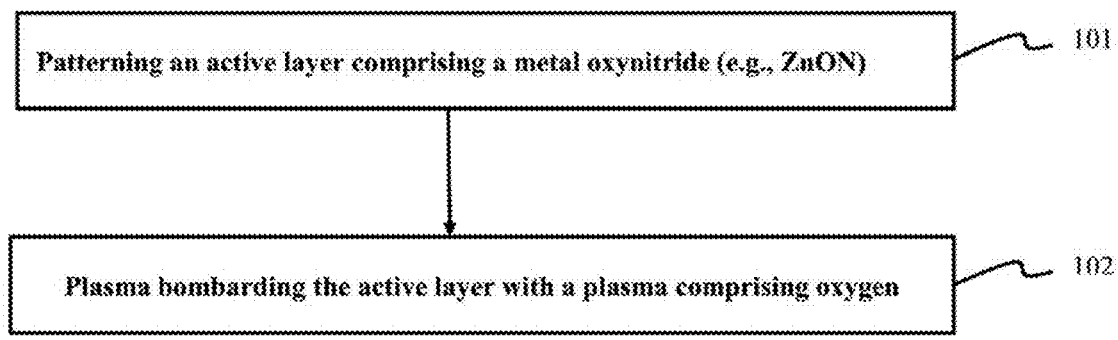
FIG. 1 is a flow chart illustrating a method of manufacturing an array substrate according to an illustrative embodiment of the present disclosure.

To improve the electrical characteristics of a thin film transistor having an active layer comprising a metal oxynitride such as Zinc Oxynitride (ZnON), the present invention provides a novel thin film transistor, an array substrate and a display panel having the same, and a method of manufacturing thereof.

In one aspect, the present invention provide a method of manufacturing a thin film transistor and an array substrate having the same, comprising: patterning an active layer comprising a metal oxynitride; and treating the active layer with a plasma comprising oxygen.

In some embodiments, the active layer is treated with bombardment of a plasma comprising oxygen. The treatment increases the oxygen contents of the active layer, in turn effectively decreasing the carrier density in the back channel of the active layer. Consequently, this results in a thin film transistor having a significantly lower turn-off current, a much smaller negative shift of the turn-on voltage, and a relatively large on/off current ratio. Accordingly, enhanced display quality is achieved using a thin film transistor with these improved electrical characteristics.

Optionally, the thin film transistor is a bottom gate type thin film transistor. Optionally, the method further comprises, prior to the step of plasma bombarding the active layer with a plasma comprising oxygen, forming and patterning an etching stop layer on top of the active layer pattern.

In subsequent source-drain electrode layer patterning process (e.g., by etching), the etching stop layer can effectively protect the back channel of the active layer from being etched and damaged. In addition, with an etching stop layer, the plasma bombardment with a plasma comprising oxygen is mostly applied to the portion of the back channel where the active layer is in contact with the source-drain electrode layer. As a result, the turn-off current of the thin film transistor can be effectively reduced while the overall characteristics of the thin film transistor is otherwise minimally affected.

Optionally, the method further comprises, following the step of plasma bombarding the active layer with a plasma comprising oxygen, depositing a source-drain electrode layer on top of the etching stop layer; annealing the base substrate having the deposited source-drain electrode layer, and patterning the source-drain electrode layer. By annealing the substrate having the source-drain electrode layer, oxygen plasma can be more evenly distributed in the portion of the back channel where the active layer is in contact with the source-drain electrode layer, thereby reducing the carrier density more effectively.

Optionally, the thin film transistor is a top gate type thin film transistor. Optionally, the method further comprises, following the step of plasma bombarding the active layer with a plasma comprising oxygen, annealing the substrate. By annealing the substrate having the source-drain electrode layer, oxygen plasma can be more evenly distributed in the portion of the back channel where the active layer is in contact with the source-drain electrode layer, reducing the carrier density more effectively.

Optionally, a gas is used for plasma bombarding the active layer. For example, the gas can be a gas comprising oxygen, nitrous oxide, nitric oxide, nitrogen dioxide, hydrogen peroxide, ozone, tetra-ethyl-ortho-silicate, or a combination thereof. Any other suitable oxygen-containing gas can be used in connection with the present disclosure.

Optionally, the pressure of the gas for treating the active layer ranges from 200 to 2000 mTor, and the treating time ranges from 10 to 200 seconds.

Optionally, an atmosphere comprising, e.g., nitrogen or an inert gas can be used for annealing the substrate. Using a gas such as nitrogen or an inert gas as the atmosphere for annealing the substrate prevents oxidation of the source-drain electrode layer. When the thin film transistor is a bottom gate type thin film transistor, the annealing step is preferably performed after the source-drain electrode layer is deposited. Doing so can prevent out-diffusion of oxygen plasma in the active layer during the annealing process.

Optionally, the temperature for annealing the substrate ranges from 200 to 400 Celsius, and the time for annealing the substrate ranges from 20 to 60 minutes.

In another aspect, the present invention provides a method of manufacturing a thin film transistor on a base substrate. The method comprises patterning an active layer comprising a metal oxynitride; and treating the active layer with a plasma comprising oxygen. Optionally, when making a bottom gate type thin film transistor, the method further comprises, prior to treating the active layer, forming and patterning an etching stop layer on top of the active layer pattern. Optionally, the method further comprises, following the step of treating the active layer with a plasma comprising oxygen, depositing a source-drain electrode layer on top of the etching stop layer; annealing the substrate having the source-drain electrode layer; and patterning the source-drain electrode layer. Optionally, when making a top gate type thin film transistor, the method further comprises, following the step of plasma bombarding the active layer with a plasma comprising oxygen, annealing the substrate.

Optionally, a gas is used for treating the active layer with a plasma comprising oxygen. Optionally, the gas comprises oxygen or nitrous oxide. Optionally, the pressure of the gas for treating the active layer ranges from 200 to 2000 mTor, and the treating time ranges from 10 to 200 seconds. Optionally, an atmosphere comprising nitrogen or an inert gas is used for annealing the substrate. Optionally, the temperature for annealing the substrate ranges from 200 to 400 Celsius, and the time for annealing the substrate ranges from 20 to 60 minutes.

Any suitable metal oxynitride can be utilized as the active layer material of the present disclosure. Optionally, the active layer comprises one or more metal elements, oxygen, and nitrogen. Optionally, the one or more metal elements can be selected from the group consisting of zinc, indium, gallium, tin, cadmium. Optionally, the one or more metal elements can be an element having a filled d orbital. Optionally, the one or more metal elements can be an element having a filled f orbital.

Optionally, the active layer comprises Zinc Oxynitride. Optionally, the active layer further comprises an element X in the Zinc Oxynitride, the element X is selected from the group consisting of the following or combination thereof: boron, aluminum, gallium, indium, tin, titanium, zirconium, hafnium, silicon, fluorine, chlorine, bromine, iodine, sulfur, and selenium.

Optionally, the turn-off current of the thin film transistor is at least 100 times lower than the on/off ratio of an untreated thin film transistor.

In another aspect, the present invention provides a method of manufacturing an array substrate comprising the method of manufacturing a thin film transistor according to the present disclosure.

In another aspect, the present invention provides a thin film transistor comprising an active layer comprising a metal oxynitride. The thin film transistor comprises an active layer partially covered by an etching stop layer on top of the active layer; the active layer has a first region contacting the etching stop layer, a second region contacting the source electrode, and a third region contacting the drain electrode; wherein the first region has a lower oxygen content than the second region and/or the third region. Optionally, the thin film transistor has a mobility rate ranging from 50 to 100 $cm^2/Vs$, a turn-off current less than $1\times10^{-12}$ A, and a turn-on voltage larger than $-10V$. Optionally, the active layer comprises Zinc Oxynitride. Optionally, the active layer further comprises an element X in the Zinc Oxynitride, the element X is selected from the group consisting of the following or combination thereof: boron, aluminum, gallium, indium, tin, titanium, zirconium, hafnium, silicon, fluorine, chlorine, bromine, iodine, sulfur, and selenium. Optionally, the turn-off current of the thin film transistor is at least 100 times lower than the on/off ratio of an untreated thin film transistor. Optionally, the thin film transistor has a turn-off current less than $1\times10^{-11}$ A. Optionally, the thin film transistor has a turn-on voltage larger than $-5V$. Optionally, the ratio of oxygen content in the second region and/or the third region to the oxygen content in the first region is 1.005 to 1.2. Optionally, the thin film transistor comprises one or more, two or more, three or more, or all four of the following characteristics: the ratio of oxygen content in the second region and/or the third region to the oxygen content in the first region is 1.005 to 1.2; a mobility rate ranging from 50 to 100 $cm^2Ns$; a turn-off current less than $1\times10^{-12}$ A; and a turn-on voltage larger than $-10V$.

The present invention also provides an array substrate manufactured using any method of the present disclosure, and an array substrate comprising a thin film transistor of the present disclosure. The array substrate of the present disclosure have a thin film transistor with superior electrical characteristics.

The present invention further provides a display device comprising an array substrate of the present disclosure. Due to the exceptional electrical characteristics of the array substrate, better display quality can be achieved in the display device of the present disclosure.

DETAILED DESCRIPTION OF THE DISCLOSURE

To improve the electrical characteristics of a thin film transistor having an active layer comprising a metal oxynitride, the present disclosure provides a novel thin film transistor, an array substrate and a display panel having the same, and a method of manufacturing thereof. The following non-limiting examples are provides to further illustrate the disclosure in details.

FIG. 1 shows an illustrative embodiment of a method of manufacturing a thin film transistor on a base substrate and an array substrate having the same, comprising: step 101: patterning an active layer comprising a metal oxynitride (e.g., ZnON); and step 102: treating the active layer with a plasma comprising oxygen.

The method can be used for manufacturing a thin film transistor and an array substrate for either TFT-LCD or AMOLED. Any type of thin film transistor can be made on the base substrate, including but not limited to, a top gate type thin film transistor and a bottom gate type thin film transistor. In an illustrative embodiment of the present disclosure, ZnON is the main component of the active layer. In other cases, doped ZnON material can be used to further improve the properties of the thin film transistor.

ZnON material is a potential candidate for next generation semiconductor material. However, as a thin film transistor active layer material, ZnON has exceedingly high turn-off current $I_{off}$. Its use in semiconductor display field is therefore limited. In the thin film transistor and array substrate manufacturing process of the present disclosure, the active layer is treated with a plasma comprising oxygen, e.g., by plasma bombardment. This treatment increases the oxygen contents of the active layer, in turn effectively decreases the carrier density in the back channel of the active layer. Consequently, this results in a thin film transistor having a significantly lower turn-off current, a much smaller negative shift of the turn-on voltage, and a relatively large on/off current ratio. Accordingly, enhanced display quality is achieved using a thin film transistor with these improved electrical characteristics.

Figure 3A:
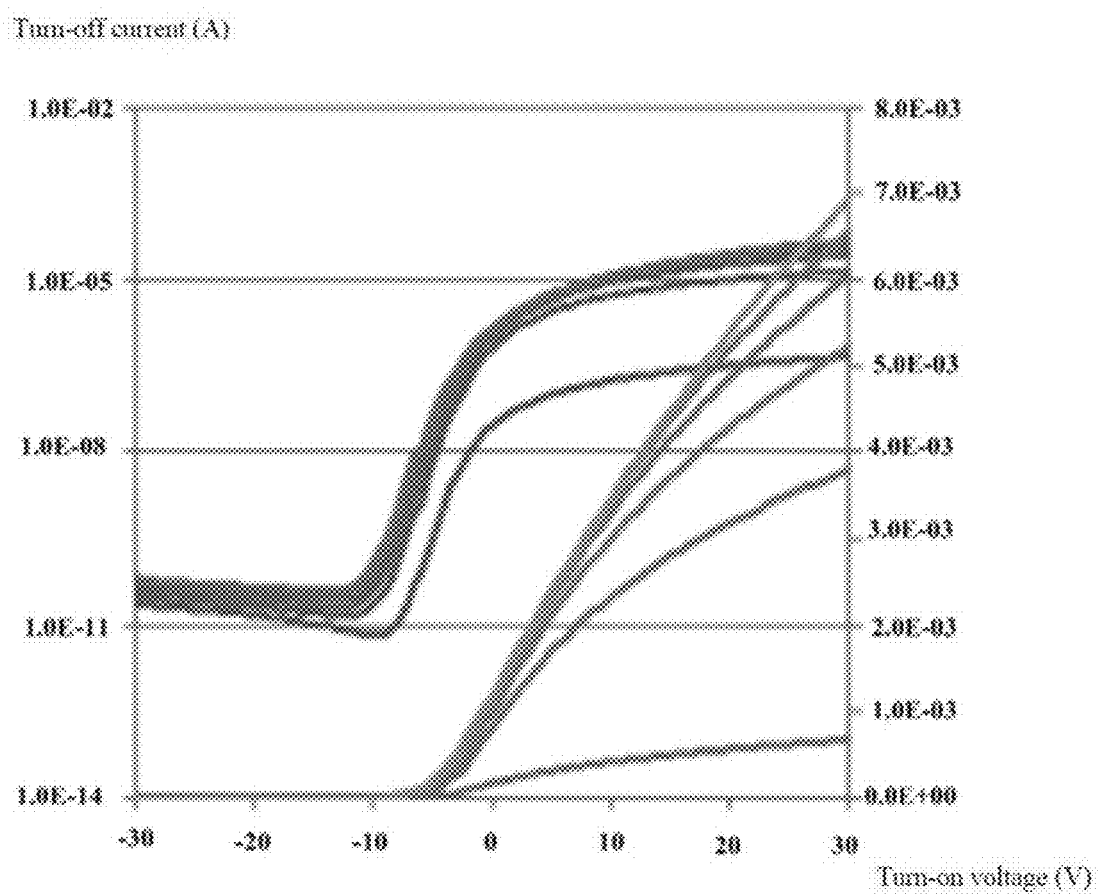
FIG. 3a shows a migration property curve of a thin film transistor having a ZnON active layer not treated with plasma bombarding with a plasma comprising oxygen.
Figure 3B:
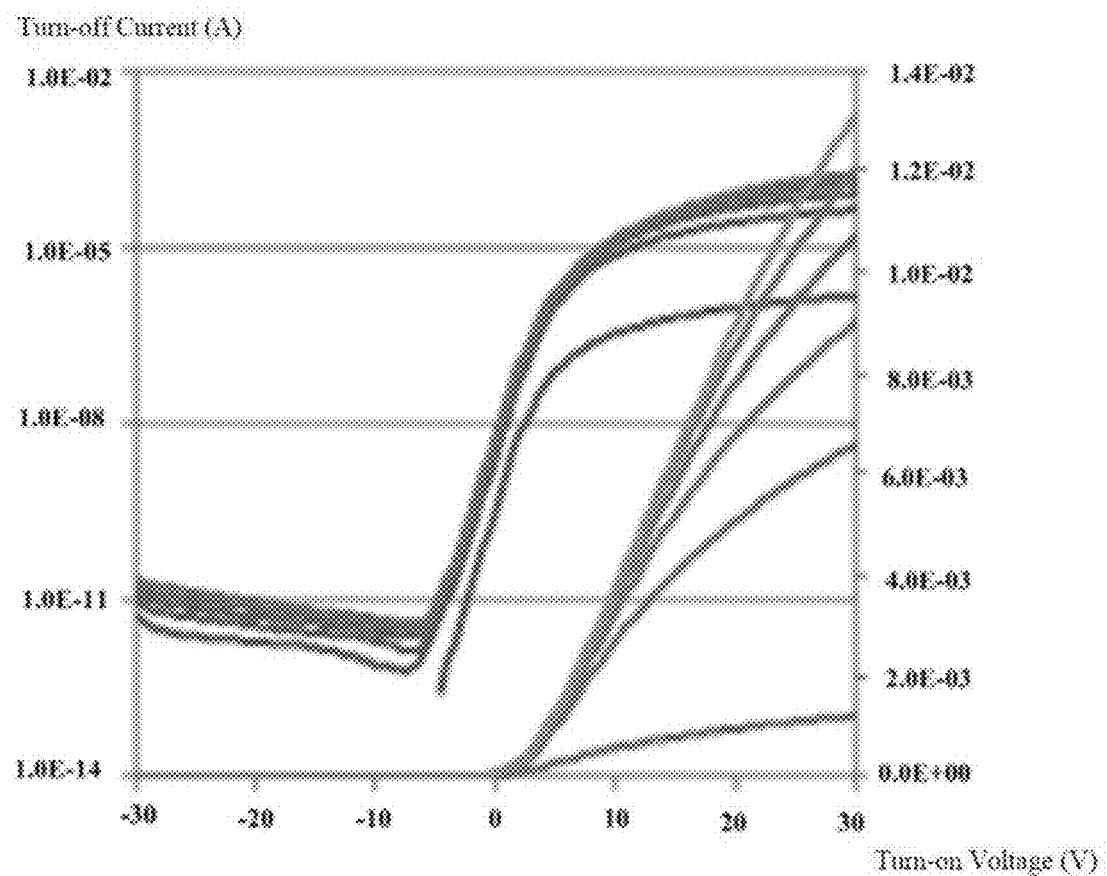
FIG. 3b shows a migration property curve of a thin film transistor having a ZnON active layer treated with plasma bombarding with a plasma comprising oxygen.

FIG. 3a shows a migration property curve of a thin film transistor having a ZnON active layer untreated with oxygen-containing plasma bombardment. As shown in the figure, a remarkable negative shift of turn-on voltage $V_{th}$ and an exceedingly high turn-off current $I_{off}$ are observed. FIG. 3b shows a migration property curve of a thin film transistor having a ZnON active layer treated with oxygen-containing plasma bombardment. As shown in the figure, after plasma bombarding the ZnON active layer with a plasma comprising oxygen, the negative shift of turn-on voltage $V_{th}$ is effectively suppressed, and the turn-off current $I_{off}$ is 100 times lower. The results are summarized in Table 1.

TABLE 1

|  | Turn-off current | Turn-on voltage |
| --- | --- | --- |
| TFT untreated with a plasma comprising oxygen | $1 \times 10^{-10}$ A | −10 V |
| TFT treated with a plasma comprising oxygen | $1 \times 10^{-12}$ A | −1 V |

In step 102, a gas may be used for plasma bombarding the active layer with a plasma comprising oxygen. The gas can be a gas comprising oxygen, nitrous oxide, nitric oxide, nitrogen dioxide, hydrogen peroxide, ozone, tetra-ethyl-ortho-silicate, or a combination thereof. Any other suitable oxygen-containing gas can be used in connection with the present disclosure. In some cases, a pressure ranging from 200 to 2000 mTor for treating the active layer can be used. Similarly, a plasma treatment time ranging from 10 to 200 seconds can be used. Typically, the power of the plasma processing apparatus ranges from 100 to 800 watts.

In some embodiments, the thin film transistor is a bottom gate type thin film transistor. Optionally, the method further comprises forming and patterning an etching stop layer on top of the active layer pattern prior to step 102, thereby forming in active layer a first region contacting the etching stop layer, a second region contacting the source electrode, and a third region contacting the drain electrode.

In subsequent source-drain electrode layer patterning process (e.g., by etching), the etching stop layer can effectively protect the back channel of the active layer from being etched and damaged. In addition, with an etching stop layer, the plasma bombardment is only applied to the portion of the back channel where the active layer is in contact with the source-drain electrode layer. In a treated thin film transistor, the oxygen content of the region contacting the etching stop layer is lower than the region contacting the drain electrode and/or the source electrode. As a result, the turn-off current of the thin film transistor can be effectively reduced while the overall characteristics of the thin film transistor is otherwise minimally affected.

Optionally, the method further comprises, following step 102: depositing a source-drain electrode layer on top of the etching stop layer; annealing the substrate having the source-drain electrode layer deposited; patterning the source-drain electrode layer.

By annealing the substrate having the source-drain electrode layer, oxygen plasma can be more evenly distributed in the portion of the back channel where the active layer is in contact with the source-drain electrode layer, reducing the carrier density more effectively.

Optionally, an atmosphere comprising nitrogen or an inert gas can be used for annealing the substrate. Using a gas such as nitrogen or an inert gas as the atmosphere for annealing the substrate prevents oxidation of the source-drain electrode layer. When the thin film transistor is a bottom gate type thin film transistor, the annealing step is preferably performed after the source-drain electrode layer is deposited. Doing so can prevent out-diffusion of oxygen plasma in the active layer during the annealing process. In some embodiments, a temperature ranging from 200 to 400 Celsius can be used for annealing the substrate. Optionally, a time ranging from 20 to 60 minutes for annealing the substrate can be used.

Figure 2A:
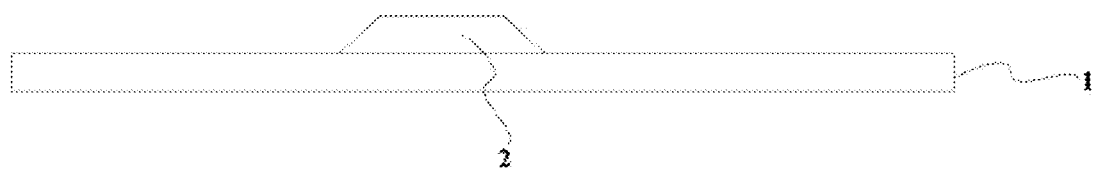
FIGS. 2a-2h illustrate the manufacturing process of an array substrate according to an illustrative embodiment of the present disclosure.
Figure 2B:
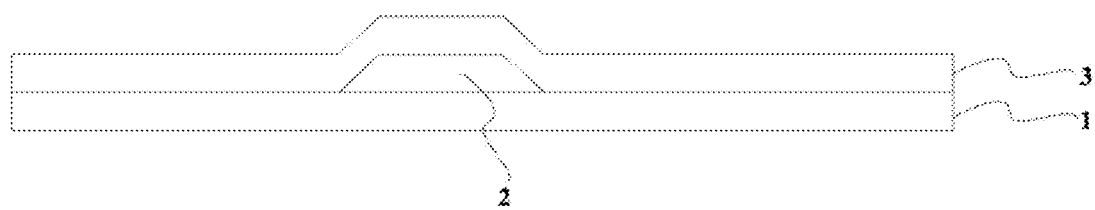
Figure 2C:
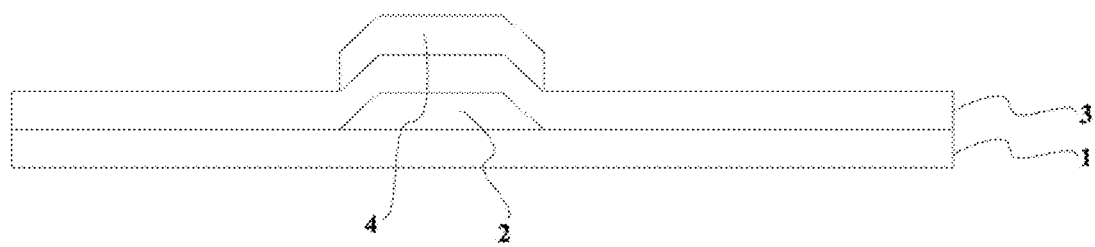
Figure 2D:
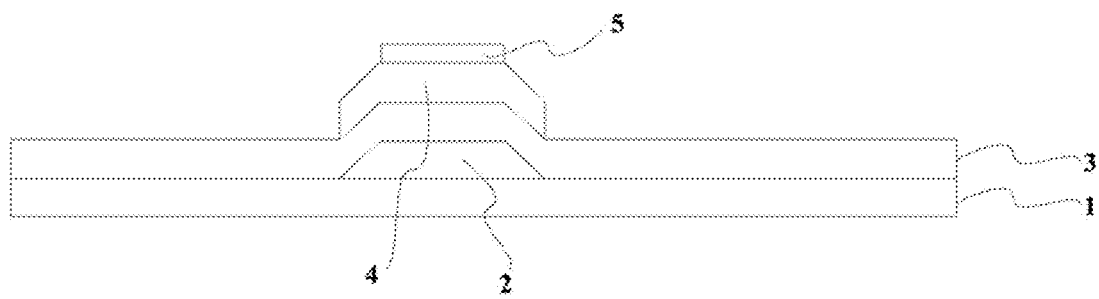
Figure 2E:
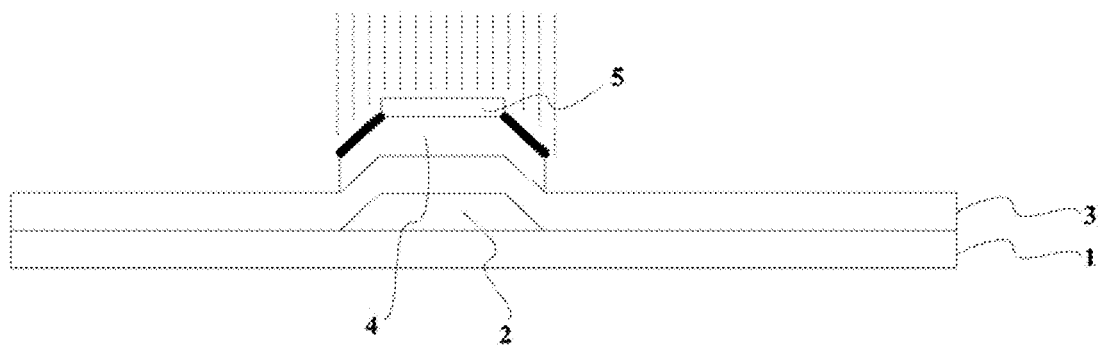
Figure 2F:
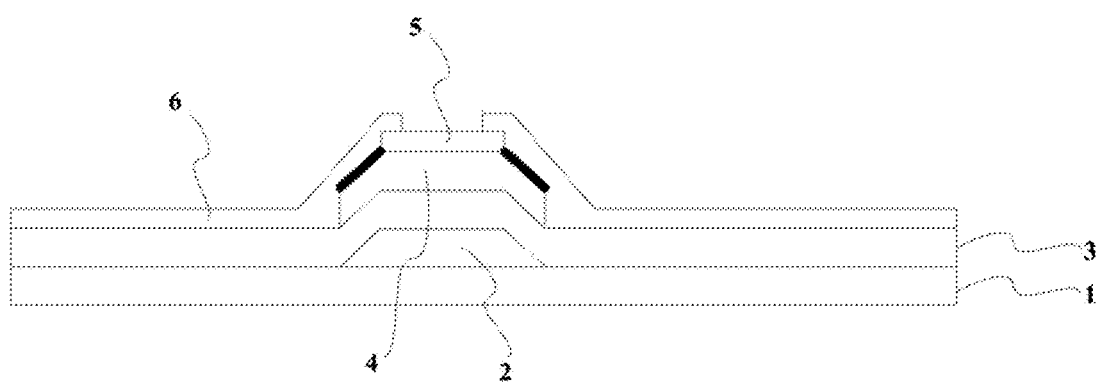
Figure 2G:
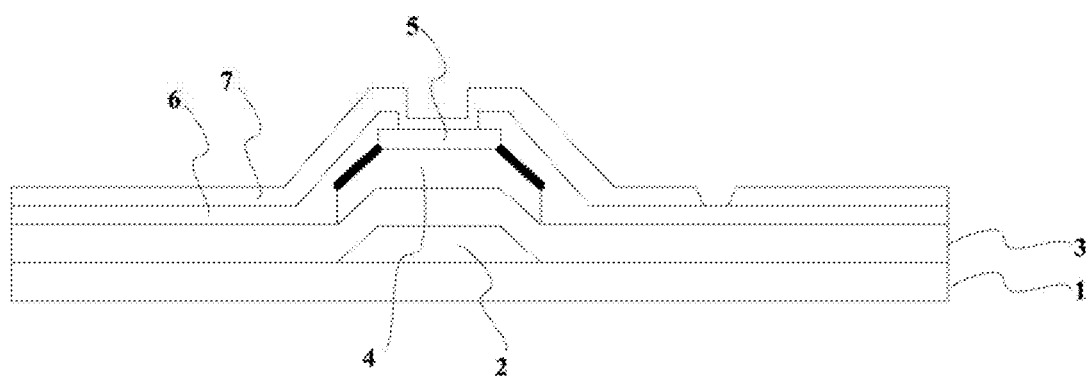
Figure 2H:
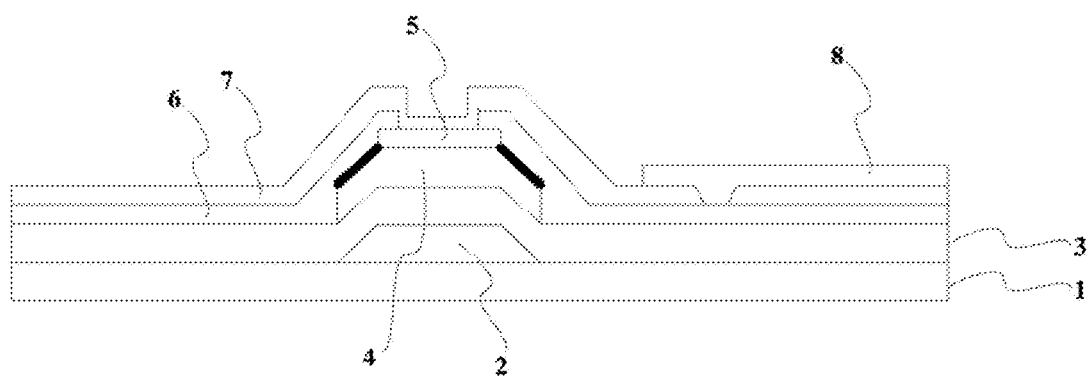

A non-limiting exemplary embodiment is shown in FIGS. 2a-2h, describing a method of manufacturing a top gate type thin film transistor array substrate. The method comprising: forming and patterning a gate layer pattern 2 on top of a base substrate 1 (FIG. 2a); forming a gate insulating layer 3 on top of the gate layer 2 (FIG. 2b); patterning an active layer 4 comprising a metal oxynitride (e.g., ZnON) on top of the gate insulating layer 3 (FIG. 2c); forming and patterning an etching stop layer 5 on top of the active layer 4 (FIG. 2d); treating the active layer 4 with a plasma comprising oxygen, increasing oxygen contents in the portion of the back channel where the active layer is in contact with the source-drain electrode layer (FIG. 2e); depositing a source-drain electrode layer 6 on top of the etching stop layer 5; annealing the base substrate 1 having the deposited source-drain electrode layer 6; patterning the source-drain electrode layer 6 (FIG. 2f); patterning a passivation layer pattern 7 comprising a via (FIG. 2g); forming a transparent electrode layer pattern 8 on top of the passivation layer 7 (FIG. 2h).

Typically, each patterning process typically comprises steps of substrate cleaning, film forming, photoresist application, exposure, developing, etching, photoresist removal, and so on. The film forming process is used to form the structural layers to be patterned. For example, a metal layer is generally formed using Physical Vapor Deposition (PVD) method (such as magnetron sputtering), and then wet-etched to form a pattern. While a non-metal layer is usually formed using Chemical Vapor Deposition (CVD) method and then dry-etched to form a pattern.

In other embodiments, the thin film transistor is a top gate type thin film transistor. The specific structure of the array substrate comprises: a source-drain electrode layer on top of a base substrate, a ZnON active layer on top of the source-drain electrode layer, a gate insulating layer on top of the ZnON active layer, a gate layer on top of the gate insulating layer. Following the step of plasma bombarding the active layer with a plasma comprising oxygen, the manufacturing method can further comprises annealing the substrate. By annealing the substrate, oxygen plasma can be more evenly distributed, thereby reducing the carrier density more effectively.

The thin film transistor of the present disclosure has superior properties. For example, the thin film transistor of the present disclosure can have a mobility rate ranging from 50 to 100 or higher $cm^2/Vs$, e.g., 50 to 75 $cm^2Vs$, 75 to 100 $cm^2/Vs$, 75 to 125 $cm^2/Vs$, or 100 to 125 $cm^2/Vs$. Also, the thin film transistor of the present disclosure has a turn-on voltage more than −10 V. For example, the thin film transistor of the present disclosure can have a turn-on voltage more than −10 V, −9 V, −8 V, −7 V, −6 V, −5 V, −4 V, −3 V, or −1 V. Optionally, the thin film transistor of the present disclosure has a turn-on voltage of −10 to 0 V, −9 to 0 V, −8 to 0 V, −7 to 0 V, −6 to 0 V, −5 to 0 V, −4 to 0 V, −3 to 0 V, −2 to 0 V, −1 to 0V, −5 to 2 V, or −5 to 5 V. In addition, the thin film transistor of the present disclosure has a turn-off current less than $1\times10^{-10}$ A. For example, the thin film transistor of the present disclosure can have a turn-off current less than $1\times10^{-11}$ A, less than $5\times10^{-11}$ A, less than $7.5\times10^{-11}$ A, less than $1\times10^{-12}$ A, less than $5\times10^{-12}$ A, less than $7.5\times10^{-12}$ A, $1\times10^{-11}$ A to $1\times10^{-10}$ A, or $1\times10^{-12}$ A to $1\times10^{-11}$ A.

The present invention thus provides a method for lowering the turn-off current of a thin film transistor having an active layer comprising a metal oxynitride (e.g., ZnON). For example, the turn-off current of a thin film transistor comprising a treated active layer can be at least 100 times lower than the turn-off current of a thin film transistor comprising an untreated active layer. In some embodiments, the turn-off current after treatment is decreased by at least 10 times, at least 25 times, at least 50 times, at least 75 time, at least 100 times, at least 150 times, or at least 200 times.

In some embodiments, the thin film transistor includes an active layer partially covered by an etching stop layer on top of the active layer. The active layer has a first region contacting the etching stop layer, a second region contacting the source electrode, and a third region contacting the drain electrode. In some embodiments, the first region has a lower oxygen content than the second region and/or the third region. As used herein, the term "oxygen content" refers to the molar ratio of oxygen atoms to the sum of nitrogen atoms and oxygen atoms. In some embodiments, the oxygen content in the second region and/or the third region is 0.5%-20%, for example, 0.5%-5%, 5%-10%, 10%-15%, 15%-20%, 5%-20%, or 10%-20%. In some embodiments, the ratio of oxygen content in the second region and/or the third region to the oxygen content in the first region is 1.005 to 1.20, e.g., 1.005-1.10, 1.05-1.20, 1.10-1.20, 1.15-1.20, 1.175-1.20, or 1.19-1.20.

The present invention also provides an array substrate manufactured using any method of the present disclosure. The array substrate of the present disclosure have a thin film transistor with superior electrical characteristics.

The present invention further provides a display device comprising an array substrate of the present disclosure. Due to the exceptional electrical characteristics of the array substrate, better display quality can be achieved in the display device of the present disclosure. The display device can be of any type, e.g., a liquid crystal display device, a liquid crystal television, an AMOLED display device, an AMOLED television, a laptop, an electronic paper display device, and so on.

The foregoing description, for purpose of explanation, has been described with reference to embodiments. The present disclosure may be embodied in other specific forms without departing from its structures, methods, or other essential characteristics as broadly described herein and claimed hereinafter. The described embodiments are to be considered in all respects only as illustrative, and not restrictive. The scope of the disclosure is, therefore, indicated by the appended claims, rather than by the foregoing description. All changes that come within the meaning and range of equivalency of the claims are to be embraced within their scope.

What is claimed is:

1. A method of manufacturing a bottom gate type thin film transistor on a base substrate, comprising:
    forming an active layer comprising a metal oxynitride;
    forming an etching stop layer on top of the active layer pattern; and
    subsequent to forming the etching stop layer, treating the active layer with a plasma comprising oxygen.

2. The method according to claim 1, wherein the method further comprising, following the step of treating the active layer with a plasma comprising oxygen,
    depositing a source-drain electrode layer on top of the etching stop layer;
    annealing a substrate having the source-drain electrode layer; and
    patterning the source-drain electrode layer.

3. The method according to claim 1, wherein the treating step comprises plasma bombarding the active layer with a plasma comprising oxygen.

4. The method according to claim 1, wherein a gas is used for treating the active layer, wherein the gas comprises oxygen or nitrous oxide.

5. The method according to claim 4, wherein the pressure of the gas for treating the active layer ranges from 200 to 2000 mTor, and the treating time ranges from 10 to 200 seconds.

6. The method according to claim 2, wherein atmosphere for annealing the substrate comprises nitrogen or an inert gas.

7. The method according to claim 6, wherein the temperature for annealing the substrate ranges from 200 to 400 Celsius, and the time for annealing the substrate ranges from 20 to 60 minutes.

8. The method according to claim 1, wherein the active layer comprises Zinc Oxynitride.

9. The method according to claim 1, wherein the active layer further comprises an element X in the Zinc Oxynitride, the element X is selected from the group consisting of the following or combination thereof: boron, aluminum, gallium, indium, tin, titanium, zirconium, hafnium, silicon, fluorine, chlorine, bromine, iodine, sulfur, and selenium.

10. The method according to claim 1, wherein the turn-off current of the thin film transistor is at least 100 times lower than the on/off ratio of an untreated thin film transistor.

11. An array substrate manufactured according to the method of claim 1.

12. A display device comprising the array substrate of claim 11.

13. A method of manufacturing a top gate type thin film transistor on a base substrate, comprising forming an active layer comprising a metal oxynitride; treating the active layer with a plasma comprising oxygen; and subsequent to treating the active layer with a plasma comprising oxygen, annealing a substrate comprising the active layer.

14. The method according to claim 13, wherein atmosphere for annealing the substrate comprises nitrogen or an inert gas.

* * * * *